US006860007B1

(12) United States Patent
Liu et al.

(10) Patent No.: US 6,860,007 B1
(45) Date of Patent: Mar. 1, 2005

(54) METHOD OF PRODUCING AN LED ROPE LIGHT

(76) Inventors: Li-Wen Liu, 3F-1, No. 193-2, Nanya St., Hsinchu (TW); Wei-Jen Liu, 3F-1, No. 193-2, Nanya St., Hsinchu (TW)

( * ) Notice: Subject to any disclaimer, the term of this patent is extended or adjusted under 35 U.S.C. 154(b) by 10 days.

(21) Appl. No.: 10/647,228

(22) Filed: Aug. 26, 2003

(51) Int. Cl.[7] .................................................. H05K 13/00

(52) U.S. Cl. ............................. 29/854; 29/825; 29/842; 29/850

(58) Field of Search .......................... 29/825, 842, 850, 29/854

(56) References Cited

U.S. PATENT DOCUMENTS 5,265,579 A * 11/1993 Ferrari ........................ 600/385
5,459,284 A * 10/1995 Bockelman et al. .......... 174/34
5,471,010 A * 11/1995 Bockelman et al. .......... 174/36

* cited by examiner

*Primary Examiner*—Carl J. Arbes

(57) ABSTRACT

A method of producing a light-emitting-diode (LED) rope light includes the steps of preparing a plurality of light seats defining a recess therein and a plurality of metal wires having two conductive plates connected to two ends thereof; positioning two conductive plates from two different metal wires in each light seat; forming the light seats into light-emitting diodes; serially connecting the light seats to provide an LED light string; positioning the LED light string into a hollow power cord holder with two electrodes of the LED light string connected to two power cords embedded in the power cord holder; and quickly enclosing said power cord holder with a transparent outer tube by way of injection molding to form an LED rope light.

9 Claims, 7 Drawing Sheets

METHOD OF PRODUCING AN LED ROPE LIGHT

FIELD OF THE INVENTION

The present invention relates to a method of quickly producing a light-emitting-diode (LED) rope light, and more particularly to a method of producing an LED rope light at largely reduced manufacturing cost and shortened time.

BACKGROUND OF THE INVENTION

A conventional rope light includes a plurality of bulbs as its light sources. These bulbs are serially connected to one another to form one or two bulb strings, which are then set in a long core tube. The core tube is cut at an outer surface to provide a longitudinal opening, via which the bulb string or strings are positioned into the core tube. Two power cords having different polarities are embedded in two opposite sides of a wall of the core tube. The two embedded power cords are cut at staggered positions to expose bare wires, to which lead wires of the first and the last bulb in the bulb strings are separately electrically connected to emit light. The core tube with bulbs is then drawn into a transparent outer tube to complete a conventional rope light. In the case two bulb strings are formed, lead wires of the bulbs must be covered with insulated sleeves to avoid a short circuit.

In the above-described conventional rope light, the bulbs are horizontally set into the core tube via the longitudinal opening provided on one side of the core tube. The existence of the longitudinal opening largely reduces an overall structural strength of the core tube. When the rope light is used on a stage or at places close to steps and tends to be twisted, deformed, trodden or impacted, the core tube with reduced structural strength is not strong enough to bear such external forces, resulting in damaged bulbs in the core tube. Moreover, it is difficult and requires increased material and labor costs to mount the insulated sleeves around the lead wires of two adjacent bulb strings that are set in the core tube at the same time. The conventional rope light with two bulb strings therefore requires increased material cost and is not easy to assemble.

Another problem with the conventional rope light is that the bulbs consume high power and generate a large amount of heat to cause deteriorated core tube and outer tube of the rope light. Broken bulbs in the deteriorated core tube and outer tube tend to cause short circuit, and the conventional rope light is therefore not safe for use.

It is therefore tried by the inventor to develop a method of producing an energy saving, safe, and environment friendly LED rope light at reduced cost and shortened assembling time to eliminate the problems existed in the conventional rope light.

SUMMARY OF THE INVENTION

A primary object of the present invention is to provide a method that enables production of an energy saving, safe, and environment friendly LED rope light at reduced cost and shortened assembling time.

To achieve the above and other objects, the method of the present invention for producing an LED rope light includes the steps of preparing a plurality of light seats defining a recess therein and a plurality of metal wires having two conductive plates connected to two ends thereof; positioning two conductive plates from two different metal wires in each light seat; processing the light seats to provide light-emitting diodes (LED); serially connecting the light seats to provide an LED light string; positioning the LED light string into a hollow power cord holder with the metal wires of the LED light string correspondingly connected to positive and negative electrodes of two power cords embedded in the power cord holder; and quickly enclosing said power cord holder with a transparent outer tube by way of injection molding to form an LED rope light.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 1 to 7, in which different steps included in the method of the present invention for producing an LED light rope are illustrated.

Figure 1:
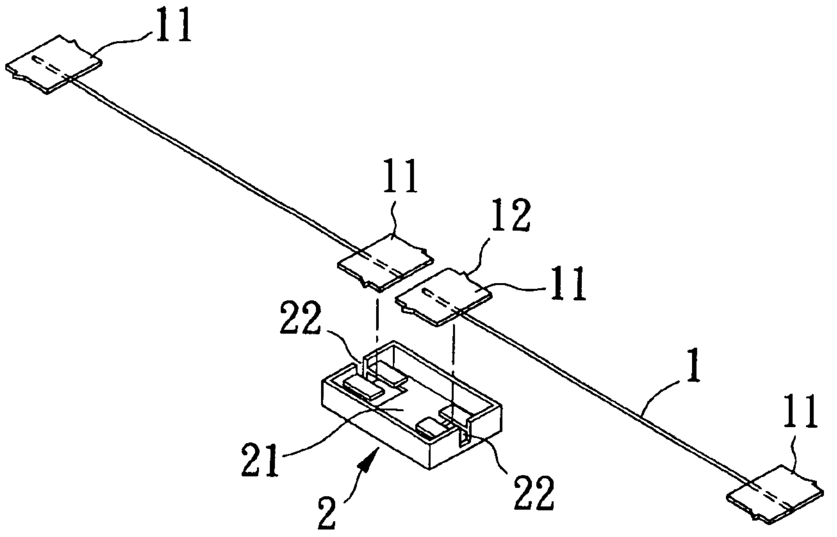
FIG. 1 illustrates the first step of the method of the present invention for producing an LED rope light.
Figure 2:
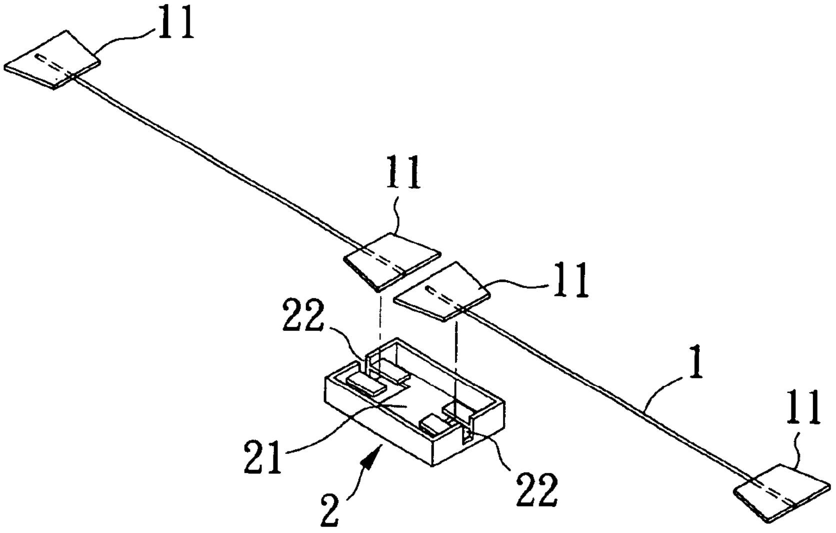
FIG. 2 is similar to FIG. 1 but shows that a differently shaped conductive plate is used to produce the LED rope light.

In the first step of the method of the present invention as shown in FIG. 1, a plurality of metal wires 1 having two rectangular conductive plates 11 connected to two ends thereof are prepared. Each of the conductive plates 11 is provided at two lateral sides with two oppositely projected teeth 12. There is also prepared a plurality of open-topped light seats 2, each of which defines a recess 21 therein. Each of the light seats 2 is provided at two transverse ends with two opposite and symmetrical notches 22. It is to be noted that the conductive plate 1 is not restricted to a rectangular plate but may be a trapezoidal plate having a shorter inner transverse end and a longer outer transverse end, as shown in FIG. 2.

Figure 3:
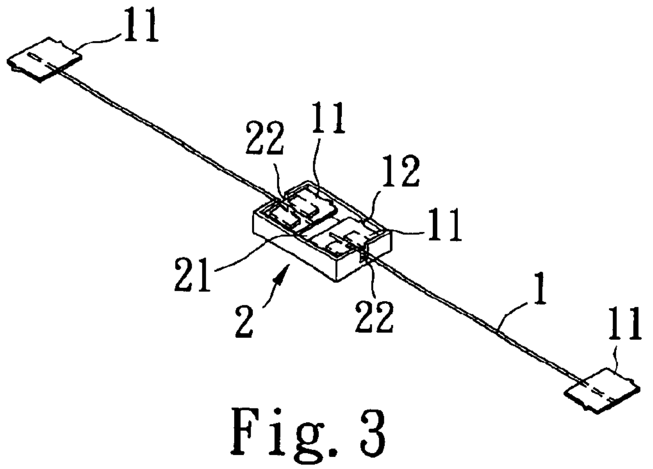
FIG. 3 illustrates the second step of the method of the present invention for producing an LED rope light.

In the second step of the method of the present invention as shown in FIG. 3, the metal wires 1 are assembled to the light seats 2, so that each light seat 2 has two metal wires 1 separately extended through the two notches 22 on the light seat 2 with one conductive plate 11 from each metal wire 1 fitly located in the recess 21 defined by the light seat 2. It is to be noted that the two conductive plates 11 located in the same one recess 21 do not contact with each other, and the two laterally projected teeth 12 on each conductive plate 11 are pressed against inner surfaces of two longitudinal sides of the recess 21 to thereby firmly hold the conductive plate 11 in place in the recess 21.

Figure 4:
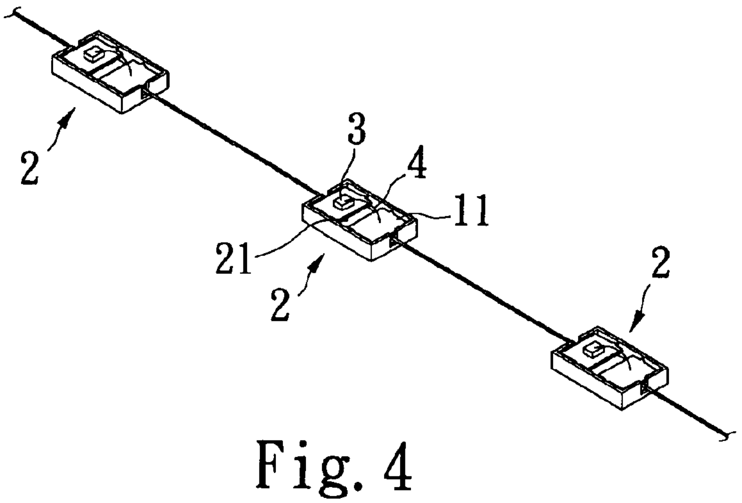
FIG. 4 illustrates the third step of the method of the present invention for producing an LED rope light.

In the third step of the method of the present invention as shown in FIG. 4, an LED chip 3 is firmly attached to one of the two conductive plates 11 in the recess 21 of each light seat 2 by means of a bonding agent, and then a metal conductor 4 is connected at positive and negative electrodes to the LED chip 3 and the other conductive plate 11 in the recess 21, respectively, with the help of a microscope, so that the a plurality of light seats 2 are electrically serially connected at a positive electrode of a first one to a negative electrode of a next one to provide a light string.

Figure 5:
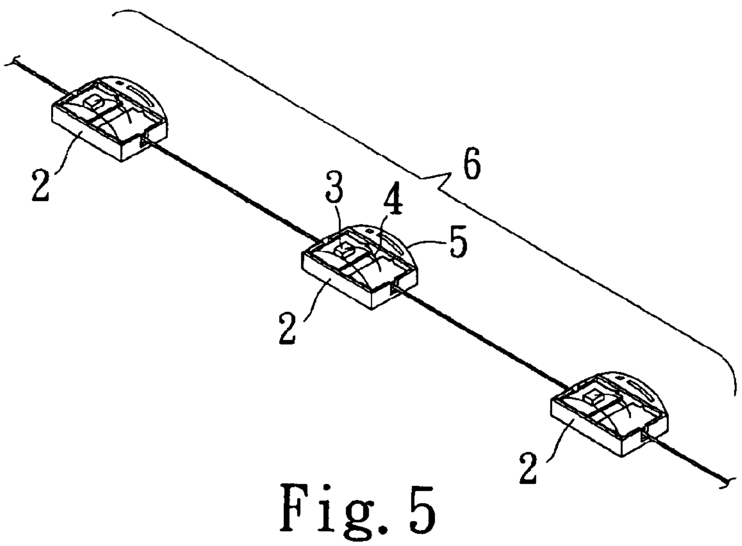
FIG. 5 illustrates the fourth step of the method of the present invention for producing an LED rope light.

In the fourth step of the method of the present invention as shown in FIG. 5, the light seats 2 in each light string are separately positioned in forming molds (not shown) and sent into an encapsulating compound injector (not shown) for encapsulation. The forming molds with the light seats 2 and injected encapsulating compound are then sent into a drying oven (not shown), so that the encapsulating compound is set to form a mask 5 over each LED chip 3, and an LED light string 6 is obtained.

Figure 6:
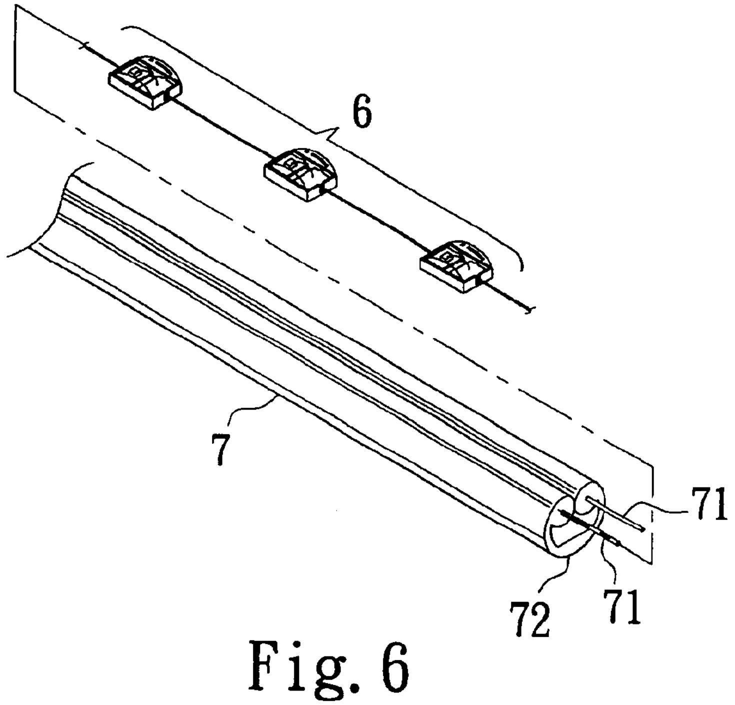
FIG. 6 illustrates the fifth step of the method of the present invention for producing an LED rope light.

In the fifth step of the method of the present invention as shown in FIG. 6, a hollow power cord holder 7 is prepared. The power cord holder 7 is cut at a top thereof to provide a V-sectioned opening, via which the light seats 2 may be implanted into an internal space of the hollow power cord holder 7. Inner and outer bottom surfaces of the power cord holder 7 opposite to the V-sectioned opening are formed into a flat surface and a convex surface 72, respectively. Two power cords 71 having two different polarities are separately embedded in two sidewall portions of the power cord holder 7. When the LED light string 6 formed from the light seats 2 is implanted into the inner space of the power cord holder 7, positive and negative electrodes at two outmost ends of the LED light string 6 are separately connected to the positive and the negative power cord 71, respectively.

Figure 7:
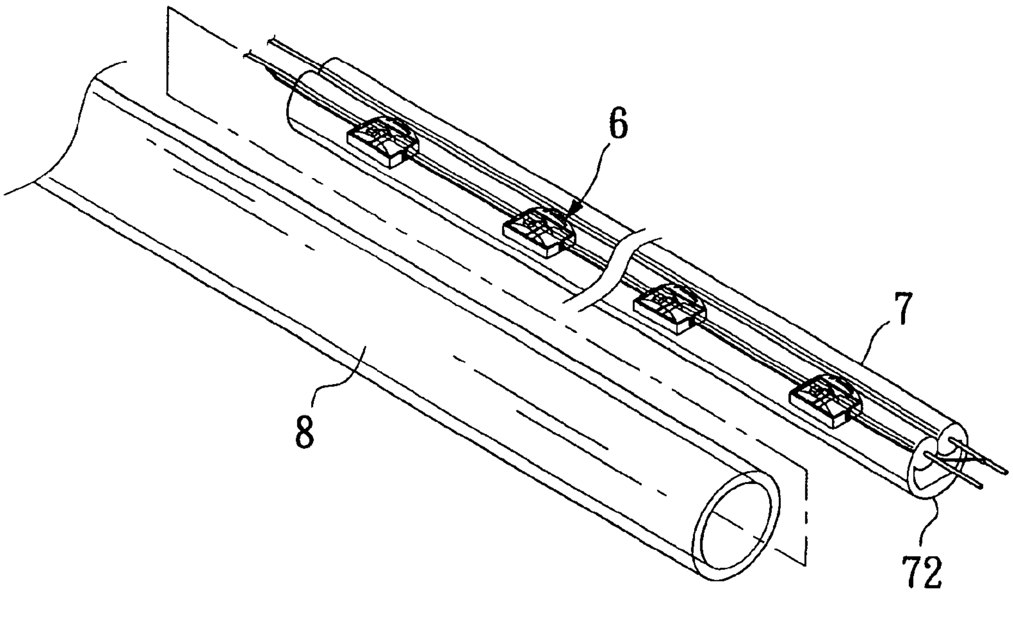
FIG. 7 illustrates the sixth step of the method of the present invention for producing an LED rope light.

In the sixth and final step of the method of the present invention as shown in FIG. 7, the power cord holder 7 along with the LED light string 6 implanted therein are positioned into an injection-molding machine (not shown), so that the power cord holder 7 with implanted LED light string 6 is quickly enclosed in a transparent outer tube 8 to form an LED rope light 9. Then, a connector 91 for connecting to a power source is connected to an end of the LED rope light 9, as shown in FIG. 8.

Figure 8:
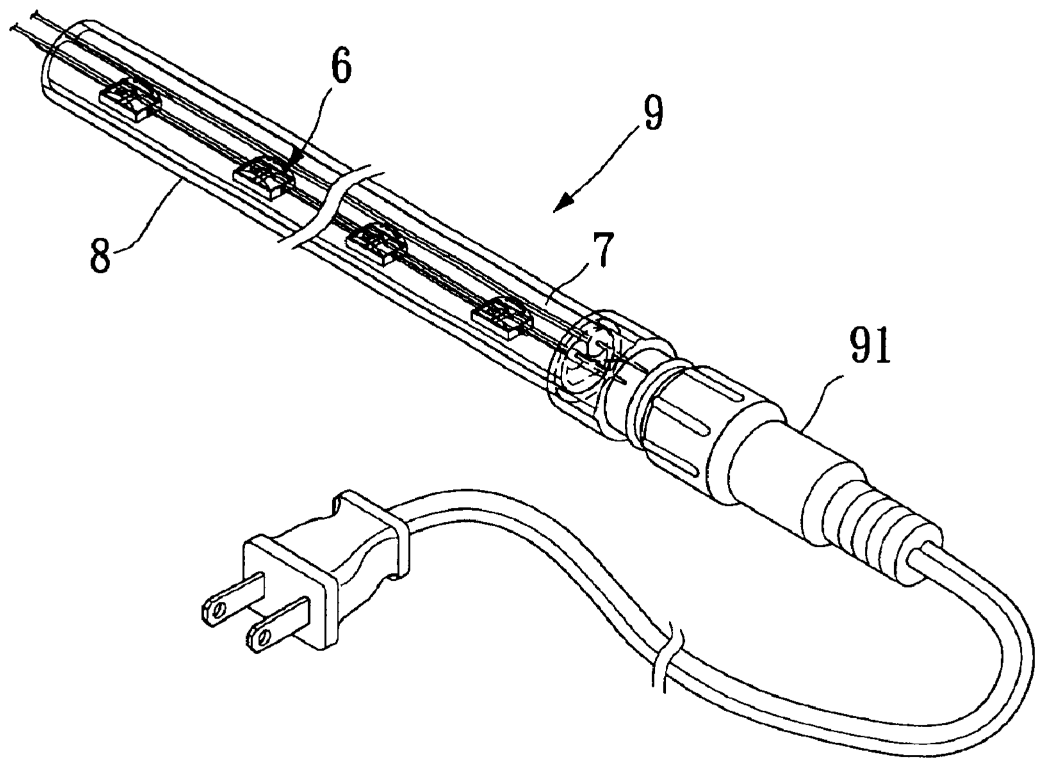
FIG. 8 illustrates a finished product of the LED rope light produced with the method of the present invention.
Figure 9:
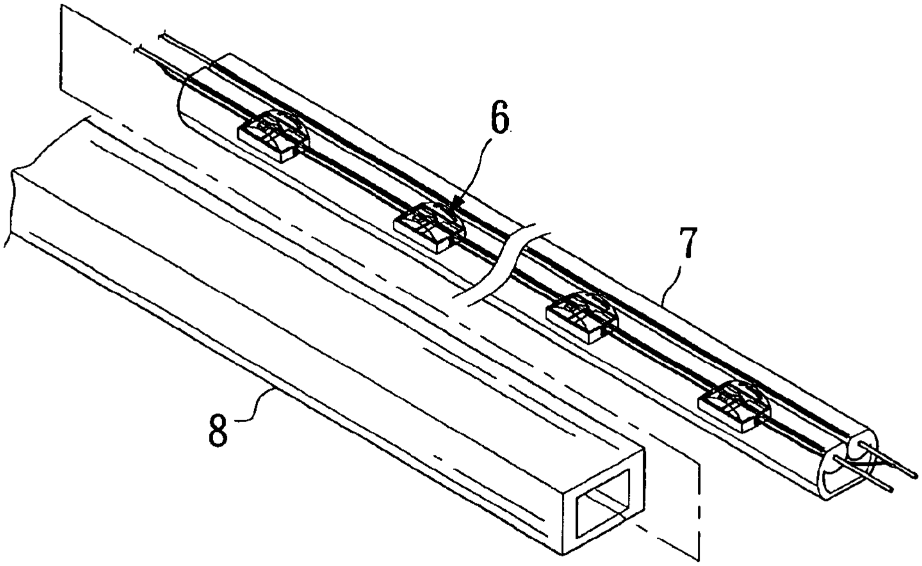
FIG. 9 is similar to FIG. 7 but shows that a differently sectioned outer tube is used to produce the LED rope light.
Figure 10:
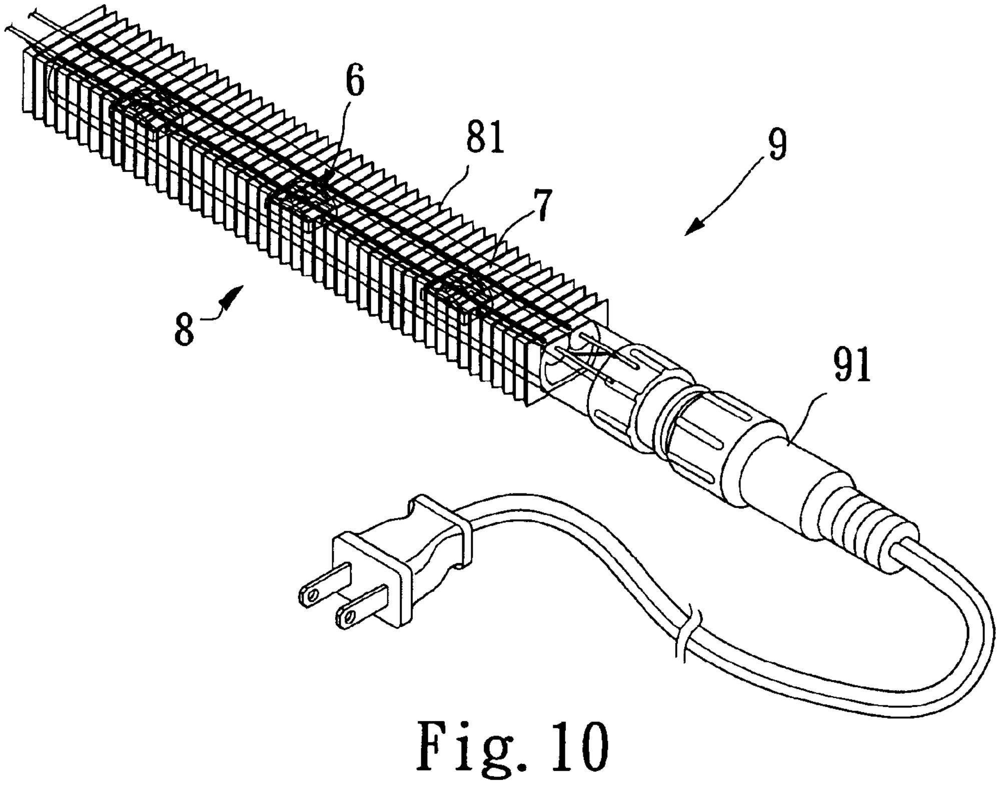
FIG. 10 illustrates another finished product of the LED rope light produced with the method of the present invention.

It is to be noted that the transparent outer tube 8 of the LED rope light 9 is not necessarily a round-sectioned tube as shown in FIGS. 7 and 8, but may have other different cross sections depending on actual needs. For example, the transparent outer tube 8 may have a rectangular cross section when it is drawn from the injection-molding machine, as shown in FIG. 9. In this case, the power cord holder 7 may have flat upper and lower outer surfaces and two convex side surfaces to correspond to the rectangular cross section of the transparent outer tube 8. Moreover, to enable the rectangular-sectioned LED rope light 9 to be highly flexible and bendable, the rectangular-sectioned transparent outer tube 8 is provided on outer surfaces with a plurality of circles of axially equally spaced grooves 81, as shown in FIG. 10.

Figure 11:
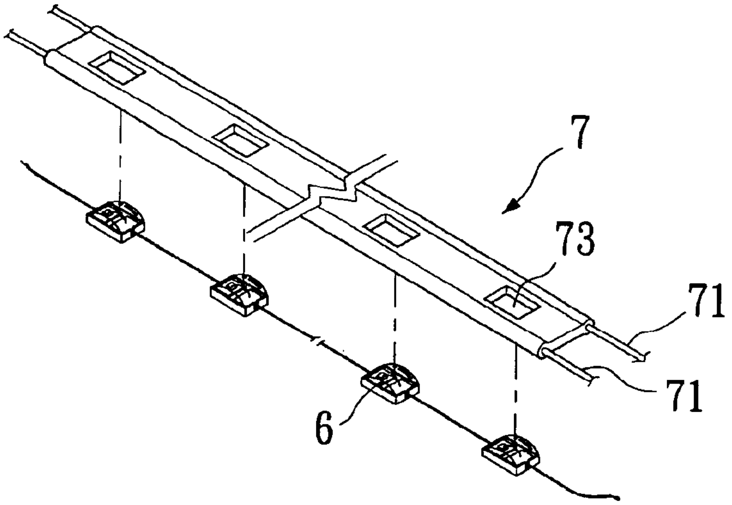
FIG. 11 illustrates a differently structured power cord holder for use in the fifth step of the method of the present invention for producing an LED rope light.
Figure 12:
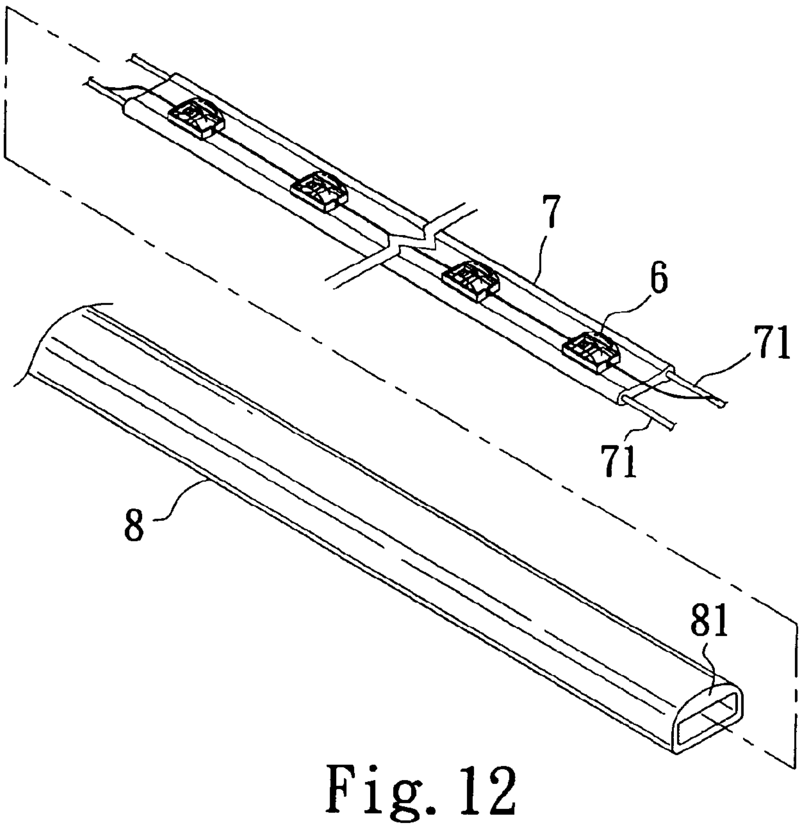
FIG. 12 illustrates a further outer tube having a cross section corresponding to that of the power cord holder of FIG. 11 for producing the LED rope light of the present invention.
Figure 13:
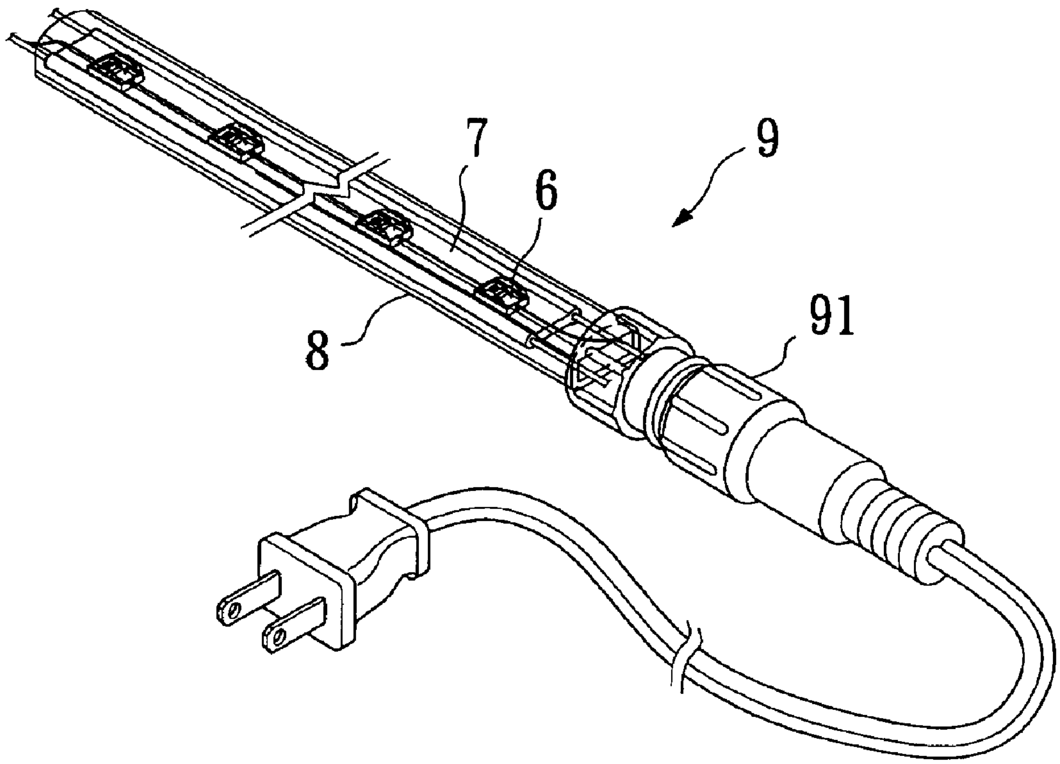
FIG. 13 illustrates another finished product of the LED rope light produced with the method of the present invention and using the power cord holder and the outer tube shown in FIGS. 11 and 12, respectively.

Alternatively, as can be seen from FIGS. 11 and 12, the power cord holder 7 prepared in the fifth step may be in the form of a long strip, on which a plurality of through holes 73 are equally spaced for the light seats 2 on the LED light string 6 to separately locate therein; and the transparent outer tube 8 produced in the sixth step may be a substantially rectangular-sectioned tube having a convex top 81, a flat bottom, and two flat sidewalls, and defining a rectangular-sectioned inner space for drawing the strip-like power cord holder 7 into the outer tube 8 to produce a finished product of the LED rope light 9 shown in FIG. 13.

With the method of the present invention, the LED rope light 9 may be produced at a largely reduced amount of raw material. The LED chips 3 of the LED rope light 9 formed with the method of the present invention are serially connected at a positive electrode of a first one and a negative electrode of a next one, and may be tested immediately after the application of the encapsulating compound. In the event the LED light string 6 is tested and proven as a good one, it is then assembled to the power cord holder 7. After the power cord holder 7 with the light string 6 assembled thereto is sent to an injection-molding machine for enclosing with the transparent outer tube 8, a finished product of the LED rope light may be obtained after the connector 91 is connected to an end thereof. In this manner, it is not necessary to troublesomely check the LED chips one by one while an energy-saving, environment-friendly, and safe LED rope light may be produced with simplified procedures, reduced loss of raw material, and shortened assembling time.

What is claimed is:

1. A method of producing an LED rope light, comprising the steps of:

preparing a plurality of metal wires having two conductive plates connected to two ends thereof, and a plurality of open-topped light seats defining a recess therein and being provided at two transverse ends with two opposite and symmetrical notches;

assembling said metal wires to said light seats, so that each said light seat has two said metal wires separately extended through said two notches on said light seat with one said conductive plate from each said metal wire fitly located in said recess defined in said light seat; said two conductive plates located in the same one said recess being separated from each other;

firmly attaching an LED chip to one of said two conductive plates in said recess of each said light seat by means of a bonding agent, and then connecting a metal conductor at positive and negative electrodes thereof to said LED chip and the other said conductive plate, respectively, so that said a plurality of light seats are electrically connected at a positive electrode of a first one to a negative electrode of a next one to provide a light string;

separately positioning said light seats in each said light string in forming molds and sending said forming molds into an encapsulating compound injector for encapsulation, sending said forming molds with said light seats and injected encapsulating compound into a drying oven, allowing said encapsulating compound to set and form a mask over each said LED chip, so that an LED light string is formed;

preparing a power cord holder that is provided in two sidewall portions with two separated power cords having different polarities for connecting to positive and negative electrodes at two outmost ends of said LED light string formed from said light seats; and positioning said power cord holder along with said LED light string implanted therein into an injection-molding machine, so that said power cord holder with said implanted LED light string is quickly enclosed in a transparent outer tube drawn from said injection-molding machine to form an LED rope light, and connecting a connector adapted to connect to a power source to an end of said LED rope light.

2. The method of producing an LED rope light as claimed in claim 1, wherein each of said conductive plates is a rectangular plate and is provided at two lateral sides with two oppositely projected teeth for pressing against inner surfaces of two lateral sides of said recess in said light seat.

3. The method of producing an LED rope light as claimed in claim 1, wherein each of said conductive plates is a trapezoidal plate having a shorter inner transverse end and a longer outer transverse end.

4. The method of producing an LED rope light as claimed in claim 1, wherein said transparent outer tube has a round cross section.

5. The method of producing an LED rope light as claimed in claim 1, wherein said transparent outer tube has a rectangular cross section and is provided on outer surfaces with a plurality of circles of axially spaced grooves.

6. The method of producing an LED rope light as claimed in claim 4, wherein said power cord holder is a hollow tubular member and cut at a top thereof to provide a longitudinal V-sectioned opening, via which said light seat are implanted into an internal space of said hollow power cord holder, and inner and outer bottom surfaces of said power cord holder opposite to said V-sectioned opening being formed into a flat surface and a convex surface, respectively.

7. The method of producing an LED rope light as claimed in claim 5, wherein said power cord holder is a hollow tubular member and cut at a top thereof to provide a longitudinal V-sectioned opening, via which said light seat are implanted into an internal space of said hollow power cord holder, and has flat upper and lower outer surfaces and two convex lateral outer surfaces to correspond to said rectangular cross section of said transparent outer tube.

8. The method of producing an LED rope light as claimed in claim 1, wherein said power cord holder is in the form of a long strip having a plurality of through holes equally spaced thereon for said light seats on said LED light string to separately locate in said through holes.

9. The method of producing an LED rope light as claimed in claim 8, wherein said transparent outer tube is a substantially rectangular-sectioned tube having a convex top, a fiat bottom, and two flat sidewalls, and defining a rectangular-sectioned inner space for drawing said long strip of power cord holder into said outer tube.

* * * * *